(12) United States Patent
Ikeda et al.

(10) Patent No.: US 10,283,446 B2
(45) Date of Patent: May 7, 2019

(54) WIRING BOARD INCLUDING MULTIPLE WIRING LAYERS

(71) Applicant: FUJITSU LIMITED, Kawasaki-shi, Kanagawa (JP)

(72) Inventors: Junya Ikeda, Atsugi (JP); Tsuyoshi Kanki, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/583,302

(22) Filed: May 1, 2017

(65) Prior Publication Data

US 2017/0352614 A1 Dec. 7, 2017

(30) Foreign Application Priority Data

Jun. 6, 2016 (JP) ................. 2016-112653

(51) Int. Cl.
*H05K 1/18* (2006.01)
*H01L 23/498* (2006.01)
*H01L 23/00* (2006.01)
*H01L 25/065* (2006.01)
*H05K 1/14* (2006.01)

(52) U.S. Cl.
CPC .. *H01L 23/49838* (2013.01); *H01L 23/49816* (2013.01); *H01L 23/49822* (2013.01); *H01L 23/49827* (2013.01); *H01L 23/49866* (2013.01); *H01L 23/49894* (2013.01); *H01L 24/17* (2013.01); *H01L 25/0655* (2013.01); *H01L 2224/16113* (2013.01); *H01L 2224/16227* (2013.01); *H05K 1/141* (2013.01); *H05K 1/181* (2013.01); *H05K 2201/10378* (2013.01); *H05K 2201/10734* (2013.01)

(58) Field of Classification Search
CPC ......... H01L 23/49816; H01L 23/49822; H01L 23/49827; H01L 23/49866; H01L 23/49894; H01L 24/17
USPC ........................................ 174/251
See application file for complete search history.

(56) References Cited

U.S. PATENT DOCUMENTS

2009/0114428 A1   5/2009   Ueno

FOREIGN PATENT DOCUMENTS

| JP | 2006-135278 | 5/2006 |
| JP | 2009-117560 | 5/2009 |
| TW | 200938015 | 9/2009 |

OTHER PUBLICATIONS

TWOA—Office Action of Taiwanese Patent Application No. 106114625 dated May 24, 2018 with full English translation.

*Primary Examiner* — Tremesha S Willis
(74) *Attorney, Agent, or Firm* — Fujitsu Patent Center (57) ABSTRACT

A wiring board includes a base board and a plurality of wiring layers formed of a resin insulating film on the base board, wherein at least one of the wiring layers includes a fine wiring, a barrier film, which is not in contact with the fine wiring, is formed at a more outer side from the base board than the wiring layer including the fine wiring, and different types of resin insulating films are used for a wiring layer at an inner side of the barrier film close to the base board and a wiring layer at an outer side of the barrier film, respectively.

7 Claims, 8 Drawing Sheets

| | 1 | 2 | 3 | 4 |
|---|---|---|---|---|
| RESIN A | POLYIMIDE RESIN | POLYIMIDE RESIN | POLYIMIDE RESIN | POLYIMIDE RESIN |
| RESIN B | POLYBENZOXAZOLE RESIN | POLYBENZOXAZOLE RESIN | POLYBENZOXAZOLE RESIN | POLYBENZOXAZOLE RESIN |

FIG. 7B

| | 5 | 6 | 7 |
|---|---|---|---|
| RESIN A | POLYBENZOXAZOLE RESIN | POLYBENZOXAZOLE RESIN | POLYBENZOXAZOLE RESIN |
| RESIN B | CYCLOOLEFIN RESIN | CYCLOOLEFIN RESIN | CYCLOOLEFIN RESIN |

FIG. 7C

| | 8 | 9 |
|---|---|---|
| RESIN A | CYCLOOLEFIN RESIN | CYCLOOLEFIN RESIN |
| RESIN B | EPOXY RESIN | EPOXY RESIN |

FIG. 7D

| | 10 |
|---|---|
| RESIN A | EPOXY RESIN |
| RESIN B | PHENOL RESIN |

FIG. 8

WIRING BOARD INCLUDING MULTIPLE WIRING LAYERS

CROSS-REFERENCE TO RELATED APPLICATION

This application is based upon and claims the benefit of priority of the prior Japanese Patent Application No. 2016-112653, filed on Jun. 6, 2016, the entire contents of which are incorporated herein by reference.

FIELD

The embodiments discussed herein are related to a wiring board.

BACKGROUND

Recently, electronic devices such as, for example, mobile phones, portable computers, and personal digital assistants (PDAs), are reduced in size and weight, and have high functionality, and as a result, a semiconductor package to be mounted in an electronic apparatus requires a reduction in size and weight and high density packaging to a mount substrate. Under this circumstance, a wafer-level chip-size package (WLP-CSP), in which a bare chip is packaged in a wafer state, has been practically used. The WLP-CSP is a package having the same size as the bare chip, and is a wiring board that connects the bare chip to a printed circuit board (PCB). In this regard, a fan-out type WLP, in which a wiring layer is formed in a wide region exceeding a bare chip area, has begun to come into wide use.

The fan-out type WLP connects the bare chip and the PCB through a fine wiring, and the used wiring requires high functionality of a device, a minute size (high density of the line/space of about 3 μm or less), and high reliability. In addition, because it is also important to reduce the costs in the fan-out type WLP, Cu (copper) is used for fabricating a wiring, and a resin such as, for example, an epoxy-based resin or a phenol-based resin, is used for fabricating an insulating film.

Figure 1:
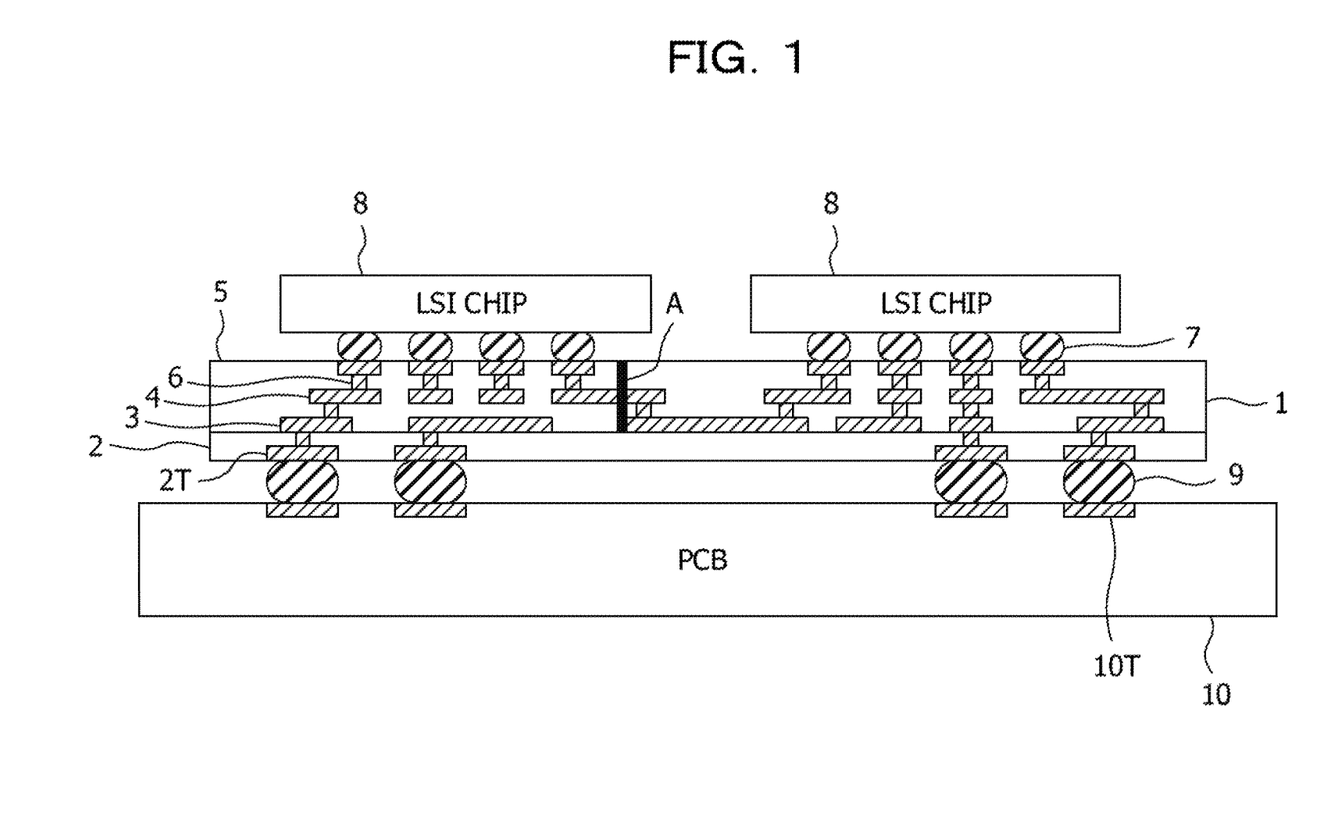
FIG. 1 is an explanatory view illustrating a structure of an interposer board in which a semiconductor chip is mounted to a PCB as a cross-sectional view.

Meanwhile, as a technology of mounting a semiconductor chip on a PCB with a fine wiring, there is a technology of mounting a plurality of semiconductor chips on the PCB through a single interposer board (a board only having a wiring layer). FIG. 1 illustrates an example of an interposer board 1. In FIG. 1, the interposer board 1 has a plurality of wiring layers 3 to 5 on a base board 2 by using a resin insulating film, and respective wiring layers are connected through vias 6. The wiring layer 3 is the first wiring layer from the base board 2, the wiring layer 4 is the second wiring layer from the base board 2, the wiring layer 5 is the first wiring layer from the base board 2, and the wiring layer 5 is called a rewiring layer.

A plurality of LSI chips 8 are mounted on the interposer board 1 through micro bumps 7. FIG. 1 illustrates only two LSI chips 8, but the number of LSI chips 8 on the interposer board 1 is not limited. In addition, the LSI chips 8 mounted on the interposer board 1 may transmit or receive signals to or from each other by the wiring layers 3 to 5 of the interposer board 1. Terminals 2T, which are connected to the wiring positioned in the first wiring layer 3, are disposed on the base board 2, and the terminals 2T are connected to land portions 10T formed on the PCB 10 through solder bumps 9.

The fine wiring in the fan-out type WLP or the interposer board is formed through a process generally called a semi-additive method, which includes patterning photoresist on seed layers made of Cu (copper), performing selective plating, and removing extra seed layers. The fine wiring will be described with reference to a structure of a portion of the interposer board 1, which is indicated by symbol A in FIG. 1, as an example.

Figure 2A:
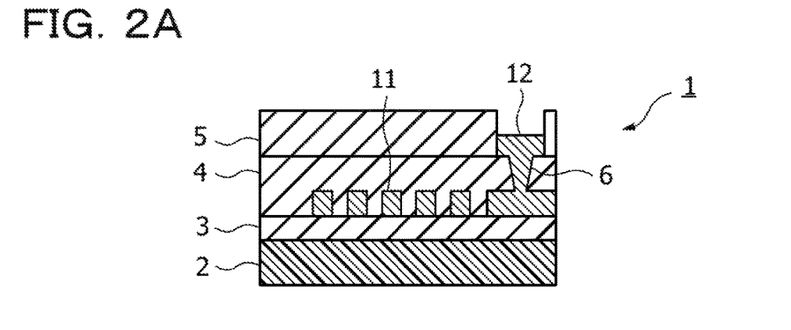
FIG. 2A is a cross-sectional view illustrating a comparative technology of a Cu wiring using a resin insulating film.

FIG. 2A is a cross-sectional view illustrating an example of a Cu fine wiring 11 using a resin insulating film in a comparative technology. Three wiring layers 3, 4, and 5 formed using resin insulating films are positioned on a base board 2 made of a resin or Si (silicon). The Cu fine wiring 11 is positioned on a wiring layer 4, which is the second wiring layer from the base board 2, and an electrode 12, which is connected to the Cu fine wiring 11 through a via 6, is positioned on the wiring layer 5, which is the third wiring layer from the base board 2. In the comparative technology, the Cu fine wiring 11 is covered by the three resin insulating layers, so that the Cu fine wiring 11 does not come into contact with water or oxygen in the outside air, and as a result, oxidation of the Cu fine wiring 11 is prevented, and thus corrosion of the Cu fine wiring 11 is avoided.

Figure 2B:
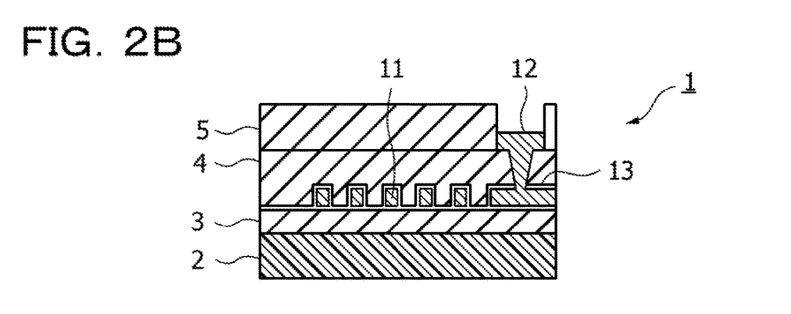
FIG. 2B is a cross-sectional view illustrating a comparative technology in which a barrier film is formed in the outer circumference of the Cu fine wiring illustrated in FIG. 2A.

FIG. 2B is a cross-sectional view illustrating a comparative technology in which a barrier film 13 is formed on the outer circumference of the Cu fine wiring 11 illustrated in FIG. 2A, and constituent elements, which are the same as those in FIG. 2A, will be denoted by the same symbols. As the barrier film 13, a SiN layer, a $SiO_2$ layer, a SiON layer, an alumina layer, and the like may be used. In the comparative technology, the Cu fine wiring 11 does not come into contact with water or oxygen in the outside air by the barrier film 13 covering the outer circumferential portion of the Cu fine wiring 11, and as a result, oxidation of the Cu fine wiring 11 is prevented to avoid corrosion of the Cu fine wiring 11.

Figure 2C:
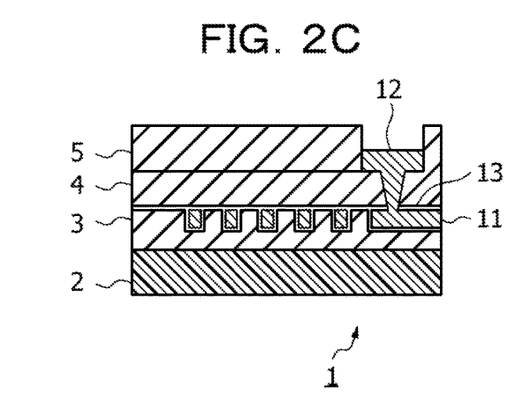
FIG. 2C is a cross-sectional view illustrating a wiring structure of a comparative technology in which a barrier layer is formed on an upper portion of the Cu fine wiring formed by using a damascene method.

FIG. 2C is a cross-sectional view illustrating a comparative technology in which the Cu fine wiring 11 is formed on the first wiring layer 3 on the base board 2 by using a so-called damascene method used for a wiring in a silicon chip. Even in the case of the Cu fine wiring 11 formed on the first wiring layer 3 using the damascene method, a method of coating an upper portion of the Cu fine wiring 11 with a dense and inert film as the barrier film 13 is generally used. In a comparative technology illustrated in FIG. 2C, the second and third wiring layers 4 and 5 are formed at a remote side (outer side) of the barrier film 13 from the base board 2.

However, in the techniques for preventing oxidation of the Cu fine wiring in the comparative technologies as described above, the resin between the fine wiring 11 deteriorates by being oxidized or hydrolyzed by oxygen or water that diffuses and permeates from the environment, thereby affecting dielectric characteristics or the like. In addition, because water, oxygen, or the like permeates to the vicinity of the Cu fine wiring 11, the barrier film 13 itself deteriorates due to the influence of water, oxygen, or the like even though the Cu fine wiring 11 is covered by the barrier film 13, and as a result, the Cu fine wiring 11 is also corroded, and electrical conduction characteristics of the Cu fine wiring 11 are also adversely affected in some cases.

In a case where a dense inorganic film (SiN or $SiO_2$, or $Al_2O_3$, etc.) is used as the barrier film 13 in the wiring structure itself using the resin insulating film, there is concern that a crack is formed due to a difference between the inorganic film and the resin in respect to a thermal expansion coefficient or stress. In order to avoid the crack, it is necessary to form the barrier film 13 to be very thin (at least 50 nm or less). Further, in order to form the very thin barrier film 13, a technique associated with a surface reaction, such as an atomic layer deposition (ALD) method, is generally and conveniently used.

However, when SiN, $SiO_2$, $Al_2O_3$, or the like is used to form a very thin film as the barrier film 13 through the ALD method in a portion including the resin insulating film of the second wiring layer 4 and the Cu fine wiring 11 as illustrated in FIG. 2B, the following problems occur. That is, because of a difference in a reaction rate with an ALD source gas on the Cu or the resin, the barrier film 13 tends to be thinly deposited on the Cu, and thickly deposited on the resin, and there is a problem associated with reliability in that a probability that a crack is formed due to the thickly deposited barrier film 13 is high.

Figure 2D:
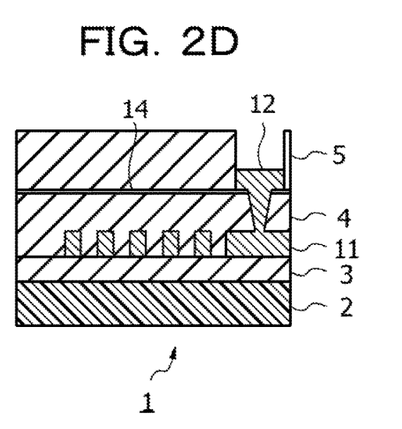
FIG. 2D is a cross-sectional view illustrating a comparative technology in which an inorganic barrier film is disposed at a portion that is not in contact with the Cu fine wiring.

As a means for solving the problems, as illustrated in FIG. 2D, there is a structure in which an inorganic barrier film 14 is disposed in a portion which is located at a side distant from the base board 2 and is not in contact with the Cu fine wiring 11. This structure has an effect of preventing oxidation to a certain degree, but oxygen or the like in the environment, which has penetrated the resin insulating film, easily reaches the inorganic barrier film 14, and deteriorates the inorganic barrier film 14 itself so that the oxygen or the like reaches the Cu fine wiring 11. Therefore, this structure is also not sufficient to prevent the oxidation of the Cu fine wiring 11, that is, to improve the reliability of the Cu fine wiring 11. In particular, in the recent Cu fine wiring 11 having a line/space width of about 2 μm or less, the deterioration in electric resistance is very serious even if the Cu fine wiring 11 is slightly oxidized, and as a result, it is not effective even if the inorganic barrier film 14 is merely disposed in the portion that is located at a side distant from the base board and is not in contact with the Cu fine wiring 11.

The followings are reference documents.
[Document 1] Japanese Laid-Open Patent Publication No. 2006-135278 and
[Document 2] Japanese Laid-Open Patent Publication No. 2009-117560.

SUMMARY

According to an aspect of the invention, a wiring board includes: a base board; and a plurality of wiring layers formed of a resin insulating film on the base board, wherein at least one of the wiring layers includes a fine wiring, a barrier film, which is not in contact with the fine wiring, is formed at a more outer side than the base board than the wiring layer including the fine wiring, and different types of resin insulating films are used for a wiring layer at an inner side of the barrier film close to the base board and a wiring layer at an outer side of the barrier film, respectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of the present application will be described in detail based on specific examples with reference to the accompanying drawings. Further, a structure of a wiring board to be described below is a structure of a portion indicated by symbol A, of the interposer board 1 described in FIG. 1. Further, the members of the interposer board 1 of which the structures are not changed, such as, for example, the base board 2, the via 6, and the Cu fine wiring 11, are denoted by the same reference numerals as those used in FIG. 1. However, because a structure of the portion of the interposer board 1, which is indicated by symbol A, is a new structure, the following description will be made assuming that the interposer board 1 having a wiring structure to be disclosed below is a wiring board 20.

Figure 3A:
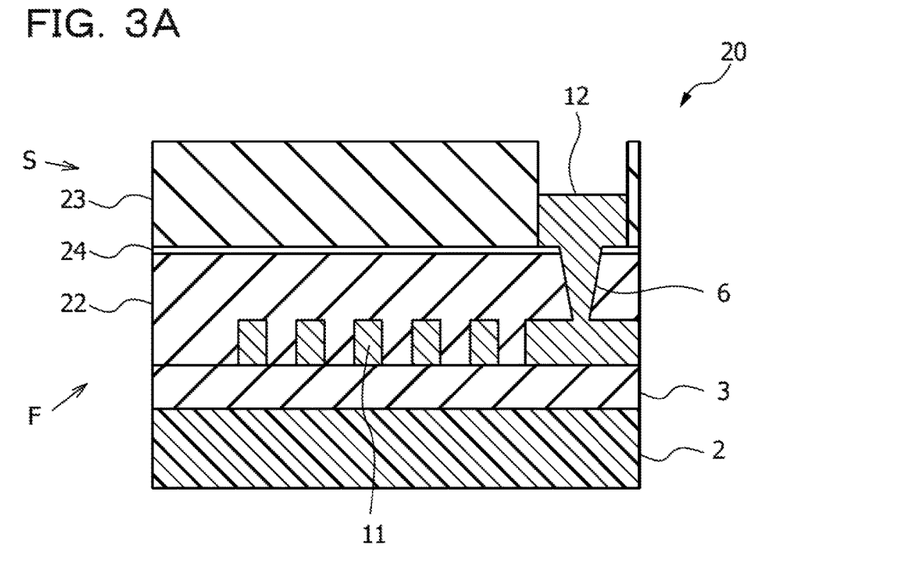
FIG. 3A is a cross-sectional view illustrating a structure of a wiring board of the disclosure.

FIG. 3A is a cross-sectional view illustrating a structure of the wiring board 20 of the disclosure. A base board 2 formed of resin or Si (silicon) is present in the wiring board 20, and a plurality of wiring layers (three wiring layers in this embodiment) are present on the base board 2. The wiring layer 21, which is the first layer from the base board 2, may be formed using the same resin insulating film as that of the comparative technology. The wiring layer 22, which is the second layer from the base board 2, and the wiring layer 23, which is the third layer from the base board 2, are formed of resin insulating films using resins having different oxidation easiness. Further, an inorganic barrier film 24 is formed between the second wiring layer 22 and the third wiring layer 23. As in the comparative technology described in FIGS. 2A to 2D, the Cu fine wiring 11 is positioned on the second wiring layer 22, and the electrode 12, which is connected to the Cu fine wiring 11 through the via 6, is positioned on the third wiring layer 23.

Here, an insulating layer, which is in contact with the Cu fine wiring 11 and is positioned at a side closer to the base board 2 than the inorganic barrier film 24 (hereinafter, referred to as an inner side of the inorganic barrier film 24), is referred to as a first insulating layer F, and an insulating layer, which is positioned at a more outer side than the inorganic barrier film 24, is referred to as a second insulating layer S. In this embodiment, the first insulating layer F is formed by the first wiring layer 21 and the second wiring layer 22, and the second insulating layer S is formed only by the third wiring layer 23. Further, the first insulating layer F may be formed only by the second wiring layer 22, and another wiring layer may be added to the second insulating layer S in addition to the third wiring layer 23.

In the wiring board 20 of the disclosure, the first insulating layer F and the second insulating layer S are formed of resin insulating films using different types of resins. In more detail, a resin, which is more easily oxidized (has a high oxidation velocity) than a resin of the first insulating layer F, is used for the resin insulating film that forms the second insulating layer S. Therefore, the second insulating layer S may act as an oxidation sacrificial layer to delay the reaching of oxidation promoting materials in the environment, such as oxygen, the first insulating layer F.

Figure 6:
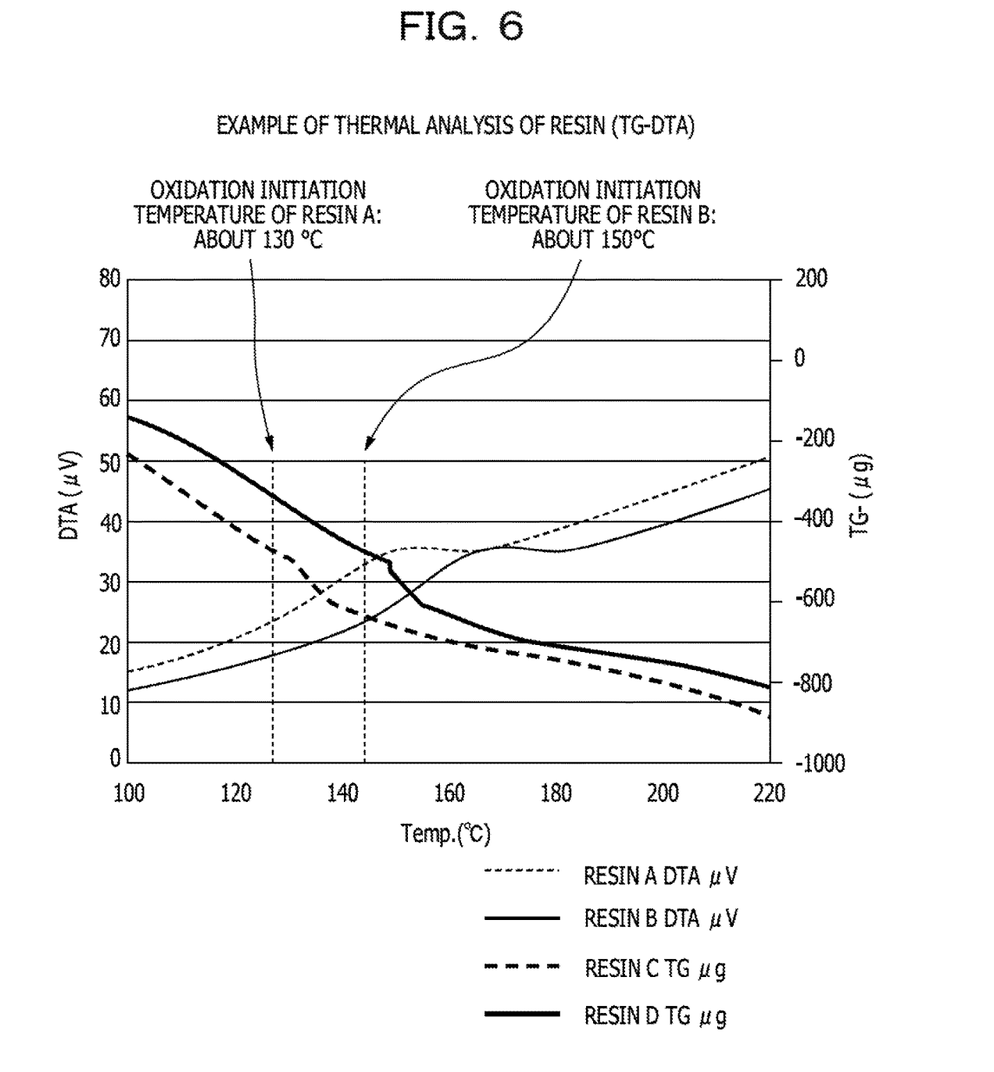
FIG. 6 is a graph illustrating an example of a quantitative determination method of an oxidation velocity of resin.

Here, when the resin A is a resin used for the first insulating layer F and the resin B is a resin used for the second insulating layer S, the resins A and B may be determined by a quantitative determination method of an oxidation velocity of the resin illustrated in FIG. 6. FIG. 6 illustrates an example of a thermal analysis (TG-DTA) of a phenol-based resin, in which the TG measures a weight of the resin while raising a temperature, and the DTA measures heat generated from the resin while raising a temperature. In the case of the resin, the oxidation is an exothermic reaction, and a reaction in which a weight is typically reduced. Thus, it may be determined from FIG. 6 that the oxidation initiation temperature of the resin A is 130° C., and the oxidation initiation temperature of the resin B is 150° C. It may be said that the higher the oxidation initiation temperature of the resin, the lower the oxidation velocity and the more difficult the oxidation, and the lower the oxidation initiation temperature of the resin, the higher the influence velocity and the easier the oxidation. Therefore, the oxidation velocities of the resin A used for the first insulating layer F and the resin B used for the second insulating layer S may be measured and determined by this method.

The resin, which may be used for the resin insulating film, is mainly a phenol resin, an epoxy resin, a cycloolefin resin, a polybenzoxazole resin, a polyimide resin, or the like. It may be seen that the order of these resins in respect to the easiness of oxidation is phenol resin>epoxy resin>cycloolefin resin>polybenzoxazole resin>polyimide resin. Therefore, based on this order, a resin, which is more easily oxidized than a resin of the first insulating layer F, may be used for the second insulating layer S.

Figure 7A:
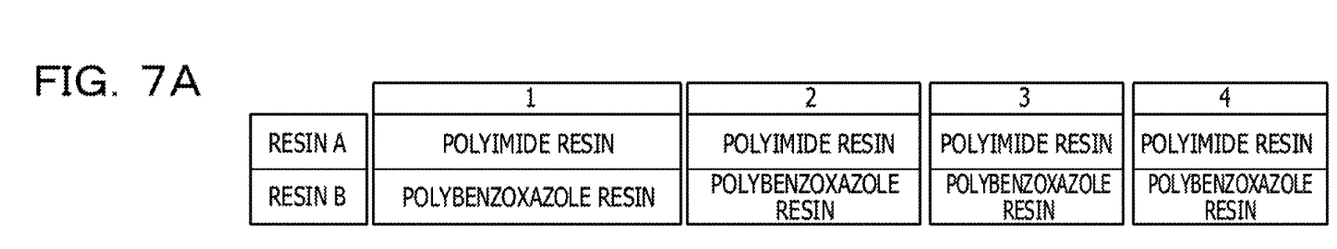
FIG. 7A is a combination view illustrating types of resins that may be used as a resin B when a polyimide resin is used as a resin A.
Figures 7B, 7C:
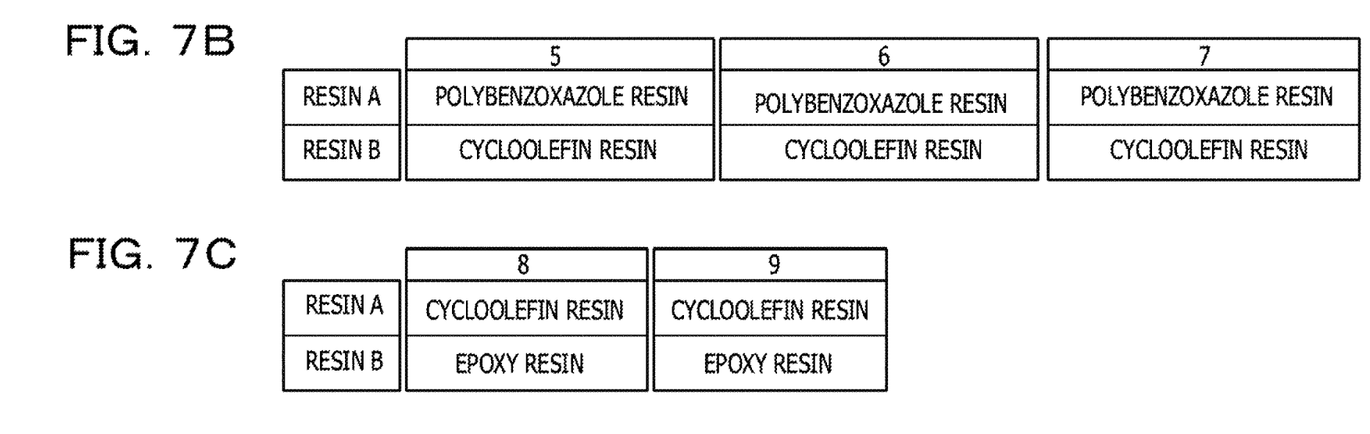
FIG. 7B is a combination view illustrating types of resins that may be used as the resin B when a polybenzoxazole resin is used as the resin A.
FIG. 7C is a combination view illustrating types of resins that may be used as the resin B when a cycloolefin resin is used as the resin A.
Figure 7D:
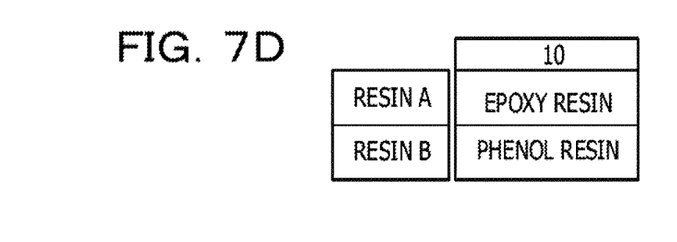
FIG. 7D is a combination view illustrating types of resins that may be used as the resin B when an epoxy resin is used as the resin A.

FIGS. 7A to 7D illustrate examples of combinations of the resin A used for the first insulating layer F and the resin B used for the second insulating layer S. As illustrated in FIG. 7A, when a polyimide resin, which is most difficult to be oxidized, is used as the resin A, any one of a polybenzoxazole resin, a cycloolefin resin, an epoxy resin, and a phenol resin, which is more easily oxidized than a polyimide resin, may be used as the resin B. As illustrated in FIG. 7B, when a polybenzoxazole resin is used as the resin A, any one of a cycloolefin resin, an epoxy resin, and a phenol resin, which is more easily oxidized than a polybenzoxazole resin, may be used as the resin B. As illustrated in FIG. 7C, when a cycloolefin resin is used as the resin A, an epoxy resin or a phenol resin, which is more easily oxidized than a cycloolefin resin, may be used as the resin B. In addition, as illustrated in FIG. 7D, when an epoxy resin is used as the resin A, a phenol resin, which is more easily oxidized than an epoxy resin, may be used as the resin B.

Figure 3B:
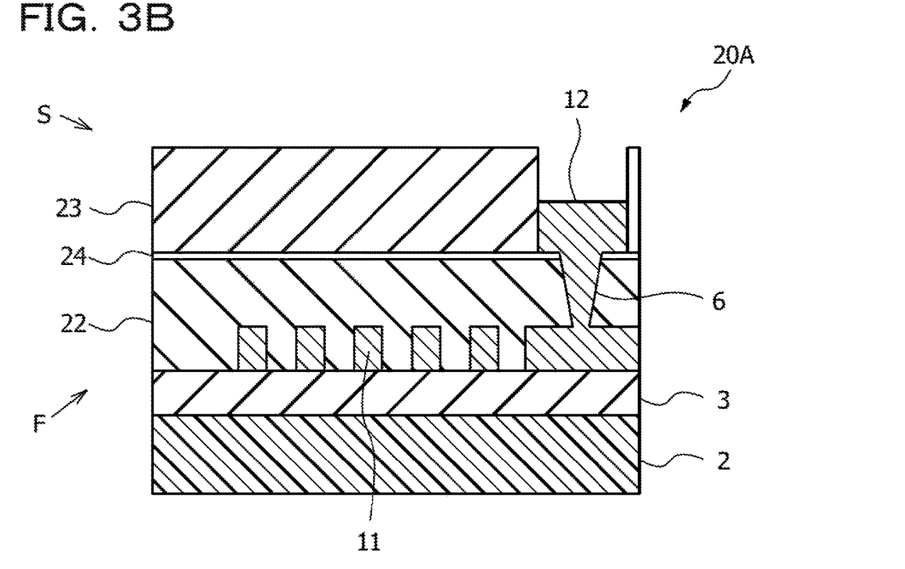
FIG. 3B is a cross-sectional view illustrating a structure of a wiring board in which, among the wiring layers in the structure of the wiring board illustrated in FIG. 3A, the resins of the second and third wiring layers are reversely disposed.

FIG. 3B is a cross-sectional view illustrating a structure of a wiring board 20A in which the types of resins of the second wiring layer 22 and the third wiring layer 23, among the wiring layers according to a structure of the wiring board 20 illustrated in FIG. 3A, are reversely disposed. That is, in the wiring board 20A illustrated in FIG. 3B, a resin, which is easily oxidized, is used for the first insulating layer F positioned at a side closer to (an inner side) the base board 2 than the inorganic barrier film 24. Further, a resin, which is more difficult to be oxidized than the resin used for the first insulating layer F, is used for the second insulating layer S positioned at a more outer side than the inorganic barrier film 24.

Figure 4:
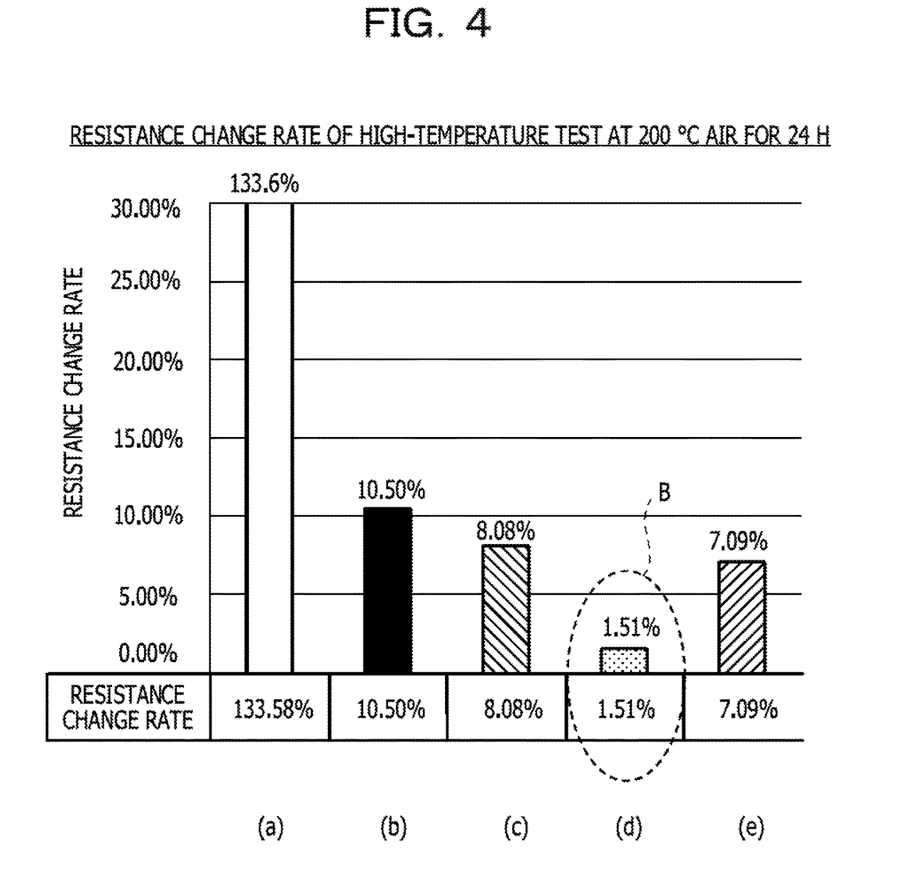
FIG. 4 is a graphs illustrating resistance change rate of high-temperature test using the wiring boards illustrated in FIGS. 2A, 2B, 2D, 3A and 3B.

FIG. 4 illustrates corrosion degrees of the Cu fine wirings 11 of the wiring board 20 illustrated in FIG. 3A, and the wiring boards 1 illustrated in FIGS. 2A, 2B, and 2D, and the wiring board 20A illustrated in FIG. 3B in comparison, after performing a high-temperature test. It may be determined that the corrosion degree of the Cu fine wiring 11 is high when the resistance change rate of the Cu fine wiring 11 increases. In this high-temperature test, the wiring resistance change rates were measured for 24 hours in a state in which the wiring width of each Cu fine wiring 11 was 1.0 μm, both of a thickness of the first wiring layer F at the inner side of the inorganic barrier film 24 and a thickness of the second wiring layer S at the outer side of the inorganic barrier film 24 were 15 μm, and a temperature was 200° C.

A graph (a) of FIG. 4 illustrates a resistance change rate of the wiring board 1 illustrated in FIG. 2A, a graph (b) of FIG. 4 illustrates a resistance change rate of the wiring board 1 illustrated in FIG. 2B, a graph (c) of FIG. 4 illustrates a resistance change rate of the wiring board 1 illustrated in FIG. 2D, a graph (d) of FIG. 4 illustrates a resistance change rate of the wiring board 20 illustrated in FIG. 3A, and a graph (e) of FIG. 4 illustrates a resistance change rate of the wiring board 20A illustrated in FIG. 3B, according to the high-temperature test. As indicated by broken line B in FIG. 4, while the wiring board 20 of the disclosure illustrated in FIG. 4 has almost no resistance change rate of the Cu fine wiring 11, the other wiring boards illustrated in FIG. 4 have high the resistance change rate of the Cu fine wiring 11. Therefore, it may be seen from FIG. 4 that in the wiring board 20 of the disclosure illustrated in FIG. 3A, the Cu fine wiring 11 is not affected by oxidation.

Figure 5A:
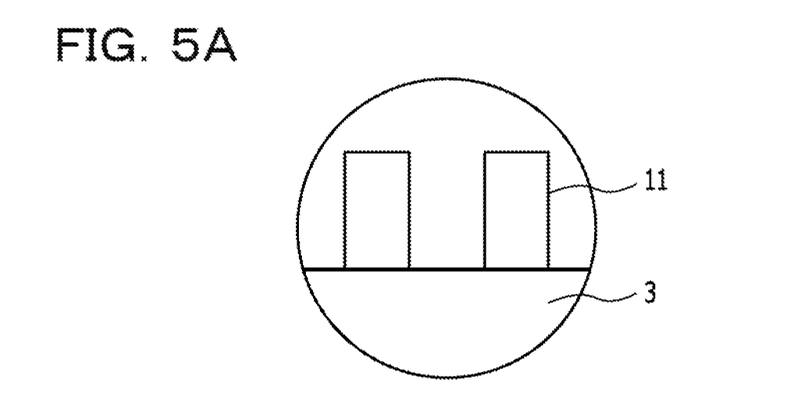
FIG. 5A is a partially enlarged cross-sectional view of the fine wiring in which a result of an oxidation test using the wiring board of the disclosure is illustrated.
Figure 5B:
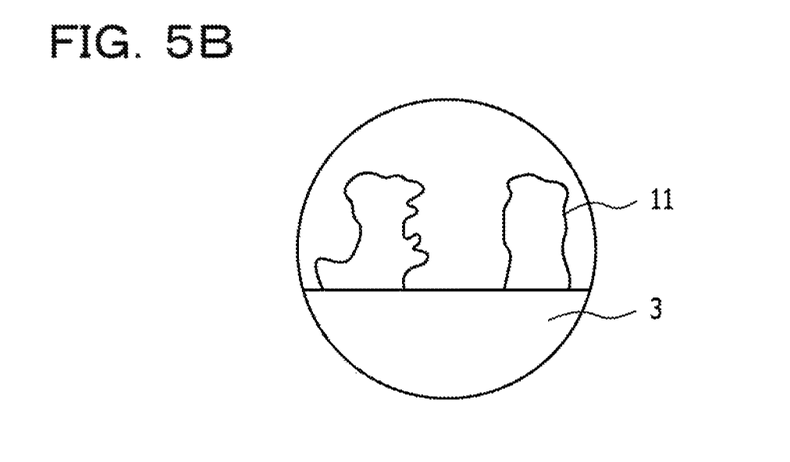
FIG. 5B is a partially enlarged cross-sectional view of the fine wiring in which a result of an oxidation test using the wiring board of the comparative technology is illustrated.

FIG. 5A is a view illustrating a state of the Cu fine wiring 11 which illustrates a result of a high-temperature test (oxidation test) using the wiring board 20 of the disclosure, and FIG. 5B is a view illustrating a state of the Cu fine wiring 11 which illustrates a result of a high-temperature test using a wiring board of the comparative technology (e.g., the wiring board illustrated in FIG. 2B). Further, because FIGS. 5A and 5B are views obtained by tracing out photographs of cross sections of the wiring board 20 of the disclosure after the high-temperature test and the wiring board 1 illustrated in FIG. 2B, a degree of deformation may be seen even though a shape of each Cu fine wiring 11 is not accurate. From the comparison of FIG. 5A and FIG. 5B, it may be seen that the Cu fine wiring 11 according to the wiring board 20 of the disclosure is hardly oxidized, while the Cu fine wiring 11 according to the comparative technology is considerably oxidized.

As described above, the wiring board 20 having the structure illustrated in FIG. 3A may improve reliability when the Cu fine wiring is used over a long period of time, and further, using the wiring board 20 having the structure illustrated in FIG. 3A enables the quality of a device product to be improved.

In the aforementioned example, of the wiring layers 21 and 22 between the inorganic barrier layer 24 and the base board 2, only the second wiring layer 22 is provided with the Cu fine wiring 11, but the Cu fine wiring 11 may also be provided on the first wiring layer 21.

Figure 8:
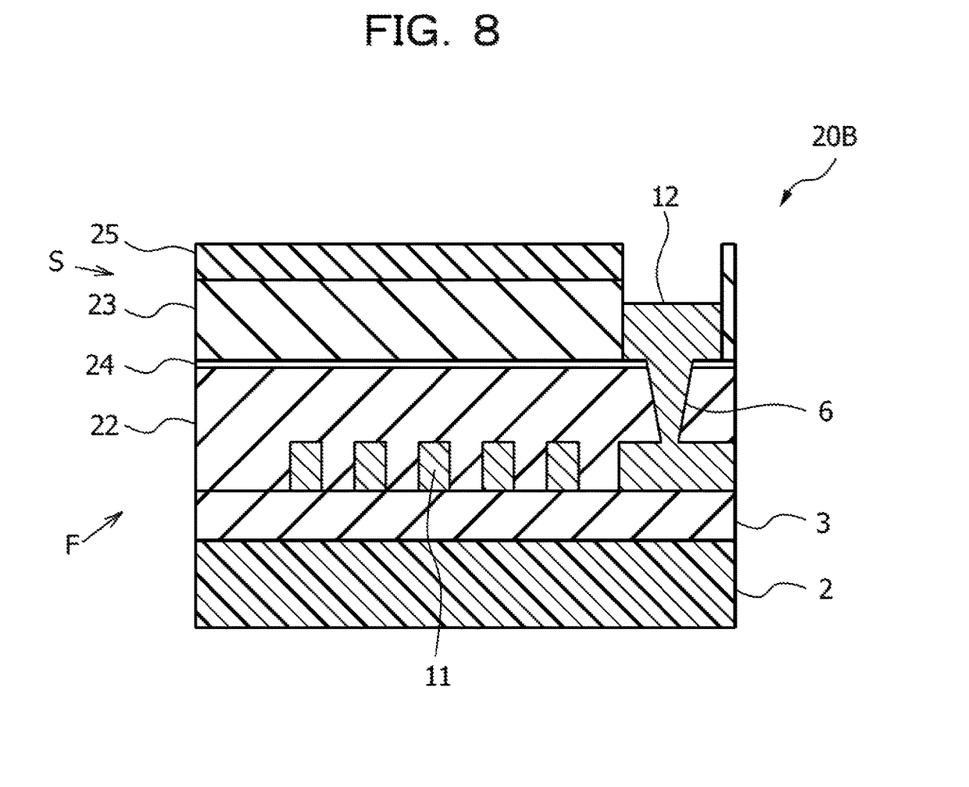
FIG. 8 is a cross-sectional view illustrating a structure of a modified example of the wiring board of the disclosure.

In the aforementioned example, the second insulating layer S is formed only by the third wiring layer 23, but as illustrated in FIG. 8, a wiring board 20B, in which the second insulating layer S is formed by the third wiring layer 23, and the fourth wiring layer 25, is enabled. In the wiring board 20B, different types of resins, which are easily oxidized, may be used as the resins used for the third wiring layer 23 and the fourth wiring layer 25. The degree of easiness of oxidation of the used resin of the third wiring layer 23 may be high, or the degree of easiness of oxidation of the used resin of the fourth wiring layer 25 may be high. However, both of the resins used for the third wiring layer 23 and the fourth wiring layer 25 are selected to be more easily oxidized than a resin used for the first insulating layer F.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
   a base board; and
   a plurality of wiring layers formed of a resin insulating film on the base board,
   wherein at least one of the wiring layers includes a fine wiring,
   a barrier film, which is not in contact with the fine wiring, is formed at a more outer side from the base board than the wiring layer including the fine wiring,
   different types of resin insulating films are used for a wiring layer at an inner side of the barrier film close to the base board and a wiring layer at an outer side of the barrier film, respectively,
   easiness of oxidation is high in an order of a phenol resin, an epoxy resin, a cycloolefin resin, a polybenzoxazole resin, and a polyimide resin, a first resin for the wiring layer at the outer side of the barrier film is selected from the resins except for the polyimide resin, and a second resin for the wiring layer at the inner side of the barrier film is selected from the resins lower than the selected resin in terms of the easiness of oxidation, and
   the plurality of wiring layers include a third resin formed at an outer side of the first resin and formed of a resin insulating film having a higher easiness of oxidation than the first resin.

2. The wiring board according to claim 1, wherein
   when the polyimide resin is selected as the second resin of the resin insulating film of the wiring layer at the inner side of the barrier film, any one of the phenol resin, the epoxy resin, the cycloolefin resin, and the polybenzoxazole resin is selected as the first resin of the resin insulating film of the wiring layer at the outer side of the barrier film,
   when the polybenzoxazole resin is selected as the second resin of the resin insulating film of the wiring layer at the inner side of the barrier film, any one of the phenol resin, the epoxy resin, and the cycloolefin resin is selected as the first resin of the resin insulating film of the wiring layer of the outer side of the barrier film,
   when the cycloolefin resin is selected as the second resin of the resin insulating film of the wiring layer of the inner side of the barrier film, the phenol resin or the epoxy resin is selected as the first resin of the resin insulating film of the wiring layer at the outer side of the barrier film, and
   when the epoxy resin is selected as the second resin of the resin insulating film of the wiring layer at the inner side of the barrier film, the phenol resin is selected as the first resin of the resin insulating film of the wiring layer at the outer side of the barrier film.

3. The wiring board according to claim 1, wherein the barrier film is an inorganic barrier film.

4. The wiring board according to claim 3, wherein the inorganic barrier film is a metal oxide film or a nitride film of $SiO_2$, SiN, SiON, or alumina, which has a film thickness less than 50 nm.

5. The wiring board according to claim 1, wherein the wiring board is an interposer board.

6. The wiring board according to claim 1, wherein the wiring board is a fan-out type wafer-level package.

7. A wiring board comprising:
   a base board; and
   a plurality of wiring layers formed of a resin insulating film on the base board,
   wherein at least one of the wiring layers includes a fine wiring,
   a barrier film, which is not in contact with the fine wiring, is formed at a more outer side from the base board than the wiring layer including the fine wiring,
   different types of resin insulating films are used for a wiring layer at an inner side of the barrier film close to the base board and a wiring layer at an outer side of the barrier film, respectively,
   easiness of oxidation is high in an order of a phenol resin, an epoxy resin, a cycloolefin resin, a polybenzoxazole resin, and a polyimide resin, a first resin for the wiring layer at the outer side of the barrier film is selected from the resins except for the polyimide resin, and a second resin for the wiring layer at the inner side of the barrier film is selected from the resins lower than the selected resin in terms of the easiness of oxidation, and the plurality of wiring layers include a third resin formed at an outer side of the first resin and formed of a resin insulating film having a lower easiness of oxidation than the first resin.

* * * * *